US011581251B2

(12) United States Patent
Patil et al.

(10) Patent No.: US 11,581,251 B2
(45) Date of Patent: Feb. 14, 2023

(54) PACKAGE COMPRISING INTER-SUBSTRATE GRADIENT INTERCONNECT STRUCTURE

(71) Applicant: QUALCOMM Incorporated, San Diego, CA (US)

(72) Inventors: Aniket Patil, San Diego, CA (US); Zhijie Wang, San Diego, CA (US); Joan Rey Villarba Buot, Escondido, CA (US); Hong Bok We, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/093,954

(22) Filed: Nov. 10, 2020

(65) Prior Publication Data

US 2022/0148952 A1    May 12, 2022

(51) Int. Cl.
| | | |
|---|---|---|
| *H01L 23/498* | (2006.01) | |
| *H01L 23/495* | (2006.01) | |
| *H01L 25/10* | (2006.01) | |
| *H01L 25/00* | (2006.01) | |

(52) U.S. Cl.
CPC .. *H01L 23/49827* (2013.01); *H01L 23/49558* (2013.01); *H01L 25/105* (2013.01); *H01L 25/50* (2013.01); *H01L 2225/107* (2013.01)

(58) Field of Classification Search
CPC ............... H01L 23/49827; H01L 23/49558
See application file for complete search history.

(56) References Cited

U.S. PATENT DOCUMENTS

| | | | |
|---|---|---|---|
| 10,242,968 B2* | 3/2019 | Das | H01L 24/16 |
| 2012/0145442 A1* | 6/2012 | Gupta | H01L 23/528 |
| | | | 174/267 |
| 2014/0009898 A1 | 1/2014 | Yamamoto | |
| 2014/0312481 A1 | 10/2014 | Choi et al. | |
| 2018/0315740 A1 | 11/2018 | Im et al. | |
| 2020/0312736 A1* | 10/2020 | Singh | H01L 23/49844 |
| 2020/0357721 A1* | 11/2020 | Sankman | H01L 23/3157 |
| 2021/0098421 A1* | 4/2021 | Wu | H01L 23/3128 |
| 2021/0407942 A1* | 12/2021 | Yu | H01L 24/19 |

FOREIGN PATENT DOCUMENTS

EP    2557906 A1    2/2013

OTHER PUBLICATIONS

International Search Report and Written Opinion—PCT/US2021/055049—ISA/EPO—dated Jan. 19, 2022.

* cited by examiner

*Primary Examiner* — Thao P Le
(74) *Attorney, Agent, or Firm* — Loza & Loza, LLP

(57) ABSTRACT

A device comprising a first package and a second package coupled to the first package. The first package includes a first substrate, at least one gradient interconnect structure coupled to the first substrate, and a first integrated device coupled to the first substrate. The second package includes a second substrate and a second integrated device coupled to the second substrate. The second substrate is coupled to the at least one gradient interconnect structure.

25 Claims, 13 Drawing Sheets

PROFILE VIEW

PROFILE VIEW

PROFILE VIEW

PROFILE VIEW

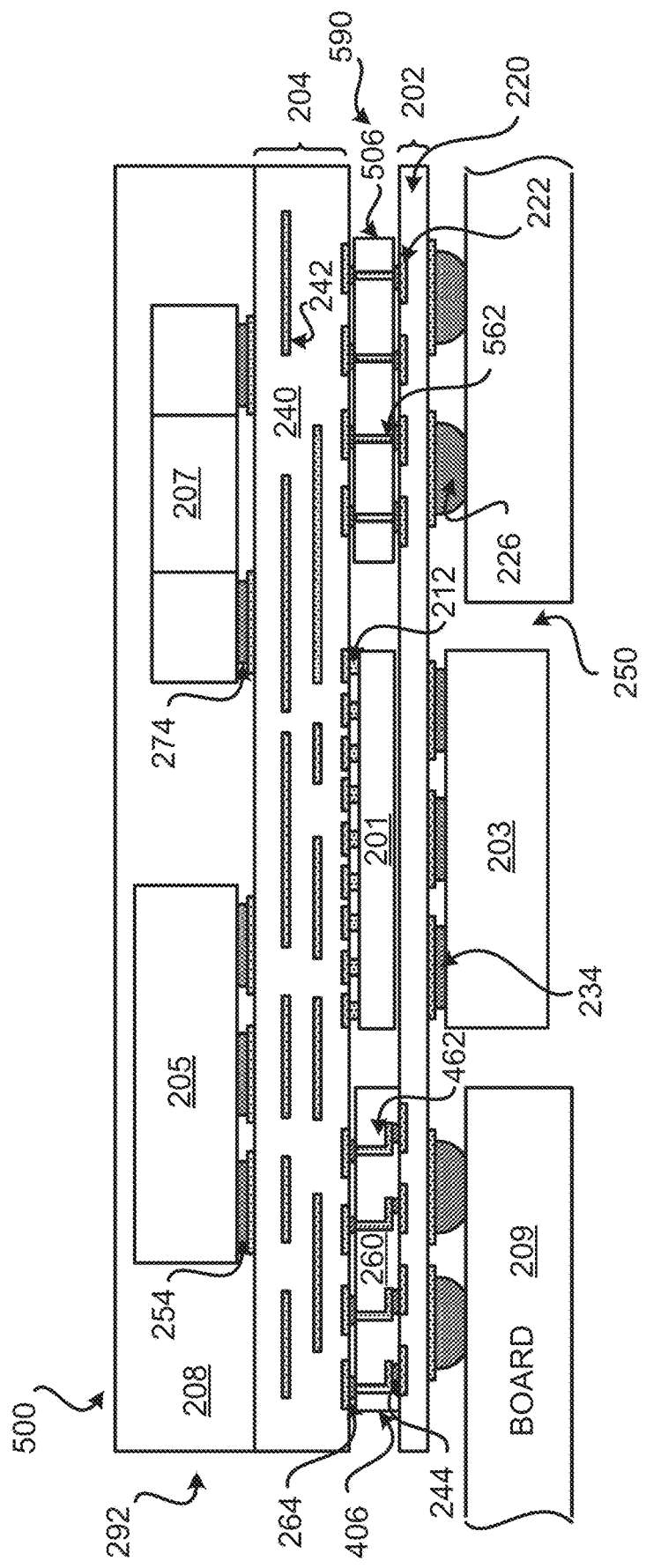

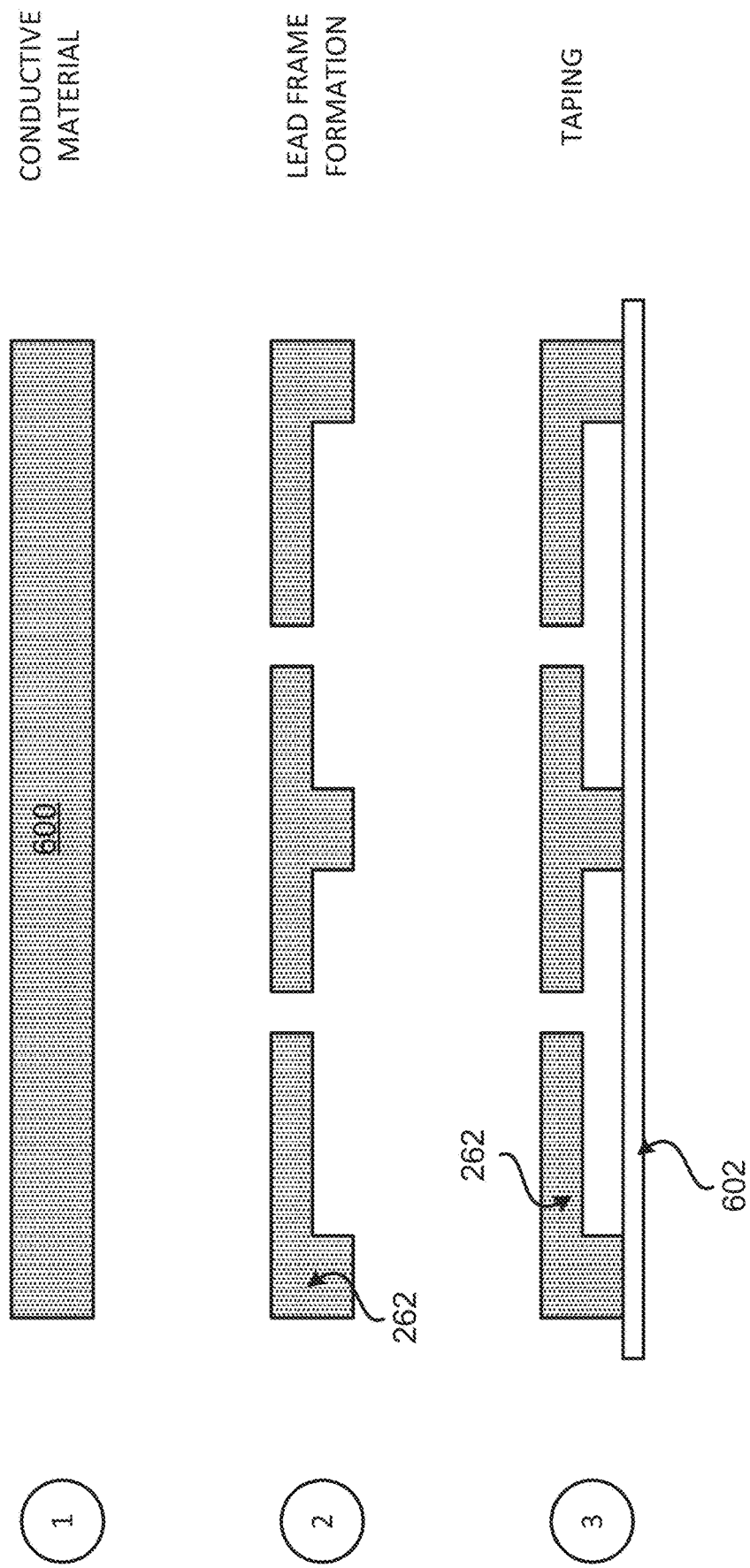

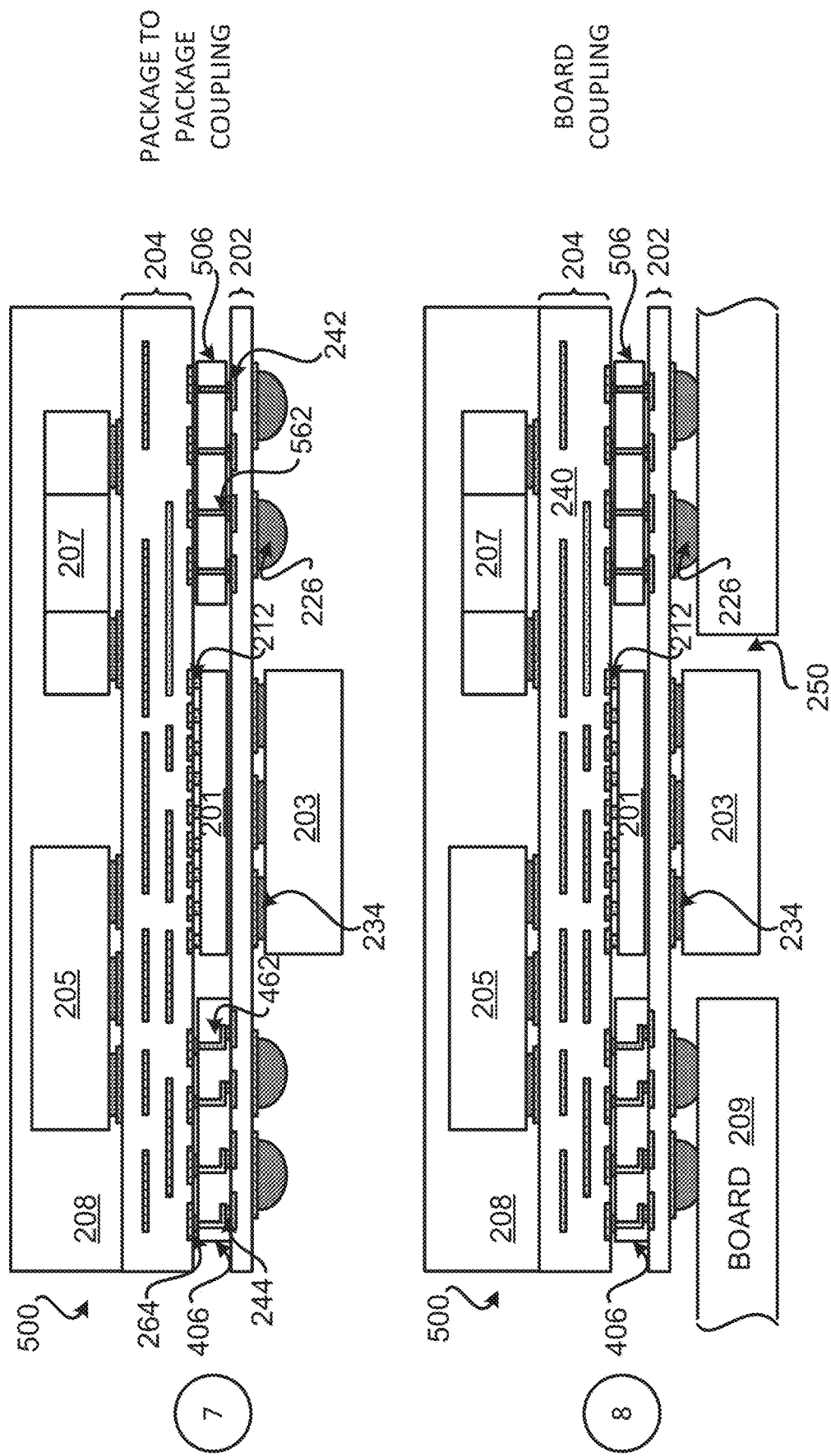

PACKAGE COMPRISING INTER-SUBSTRATE GRADIENT INTERCONNECT STRUCTURE

FIELD

Various features relate to packages and substrates.

BACKGROUND

FIG. 1 illustrates a package 100 that includes a substrate 102, an integrated device 105, and an integrated device 107. The substrate 102 includes at least one dielectric layer 120, a plurality of interconnects 122 and a plurality of solder interconnects 124. A plurality of solder interconnects 154 is coupled to a first surface of the substrate 102 and the integrated device 105. A plurality of solder interconnects 174 is coupled to the first surface of the substrate 102 and the integrated device 107. The package 100 is coupled to a board 106 through the plurality of solder interconnects 124. There is an ongoing need to provide robust and reliable packages with small form factors.

SUMMARY

Various features relate to packages and substrates, but more specifically to a package that includes gradient interconnects between substrates.

One example provides a device comprising a first package and a second package coupled to the first package. The first package includes a first substrate, at least one gradient interconnect structure coupled to the first substrate, and a first integrated device coupled to the first substrate. The second package includes a second substrate and a second integrated device coupled to the second substrate. The second substrate is coupled to the at least one gradient interconnect structure.

Another example provides an apparatus comprising a first package and a second package coupled to the first package. The first package includes a first substrate, means for gradient interconnection coupled to the first substrate, and a first integrated device coupled to the first substrate. The second package includes a second substrate and a second integrated device coupled to the second substrate. The second substrate is coupled to the means for gradient interconnection.

Another example provides a method for fabricating a device. The method provides a first package comprising a first substrate, at least one gradient interconnect structure coupled to the first substrate, and a first integrated device coupled to the first substrate. The method couples a second package to the first package. The second package includes a second substrate, wherein the second substrate is coupled to the at least one gradient interconnect structure. The second package includes a second integrated device coupled to the second substrate.

BRIEF DESCRIPTION OF THE DRAWINGS

Various features, nature and advantages may become apparent from the detailed description set forth below when taken in conjunction with the drawings in which like reference characters identify correspondingly throughout.

FIG. 5 illustrates a profile view of another package that includes gradient interconnects between substrates.

FIGS. 6A-6B illustrate an exemplary sequence for fabricating gradient interconnects.

FIGS. 8A-8C illustrate an exemplary sequence for fabricating a package that includes gradient interconnects between substrates.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device comprising a first package and a second package coupled to the first package. The first package includes a first substrate, at least one gradient interconnect structure coupled to the first substrate, and a first integrated device coupled to the first substrate. The second package includes a second substrate and a second integrated device coupled to the second substrate. The second substrate is coupled to the at least one gradient interconnect structure. The device may include a package on package (PoP). The gradient interconnect structure is located between the first substrate and the second substrate. In some implementations, the gradient interconnect structure may include an encapsulation layer and at least one continuous interconnect that extends diagonally through the encapsulation layer. In some implementations, the gradient interconnect structure may include an encapsulation layer and at least one continuous interconnect that extends vertically and horizontally through the encapsulation layer. The at least one continuous interconnect that extends vertically and horizontally through the encapsulation layer may include a lead frame interconnect. The use of the gradient interconnect structure helps reduce the thickness of the space between the first substrate and the second substrate, which helps reduce the overall height of the package.

Exemplary Packages that Include Gradient Interconnects Between Substrates

Figure 1:
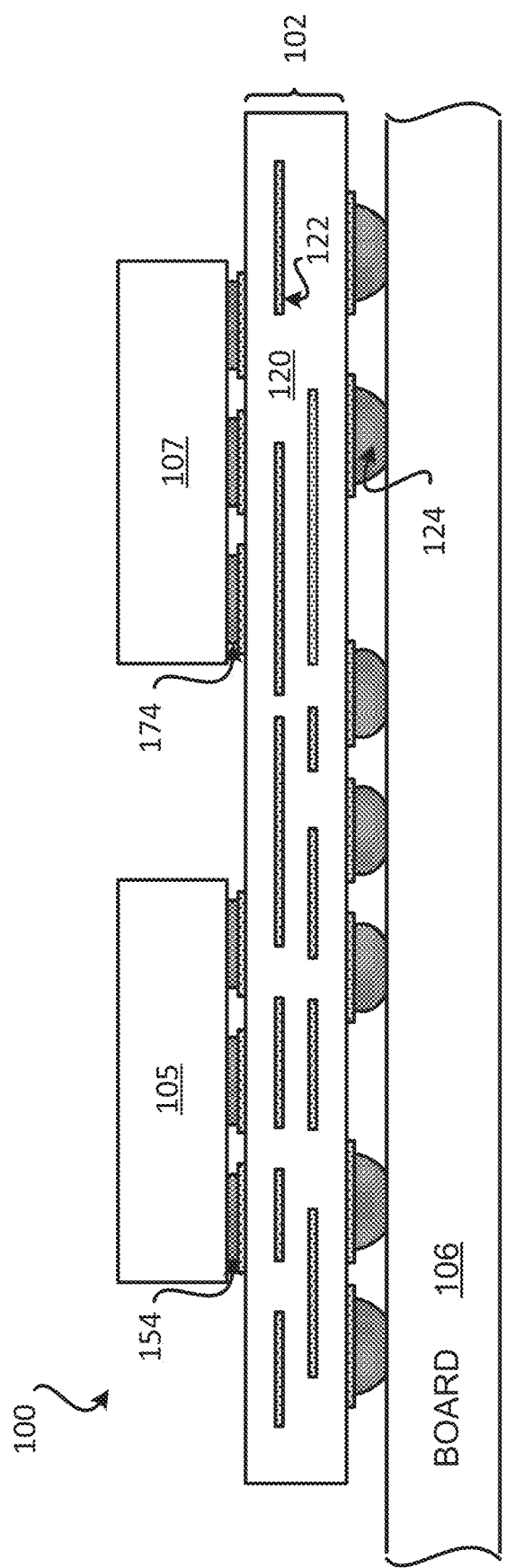
FIG. 1 illustrates a profile view of a package coupled to a board.
Figure 2:
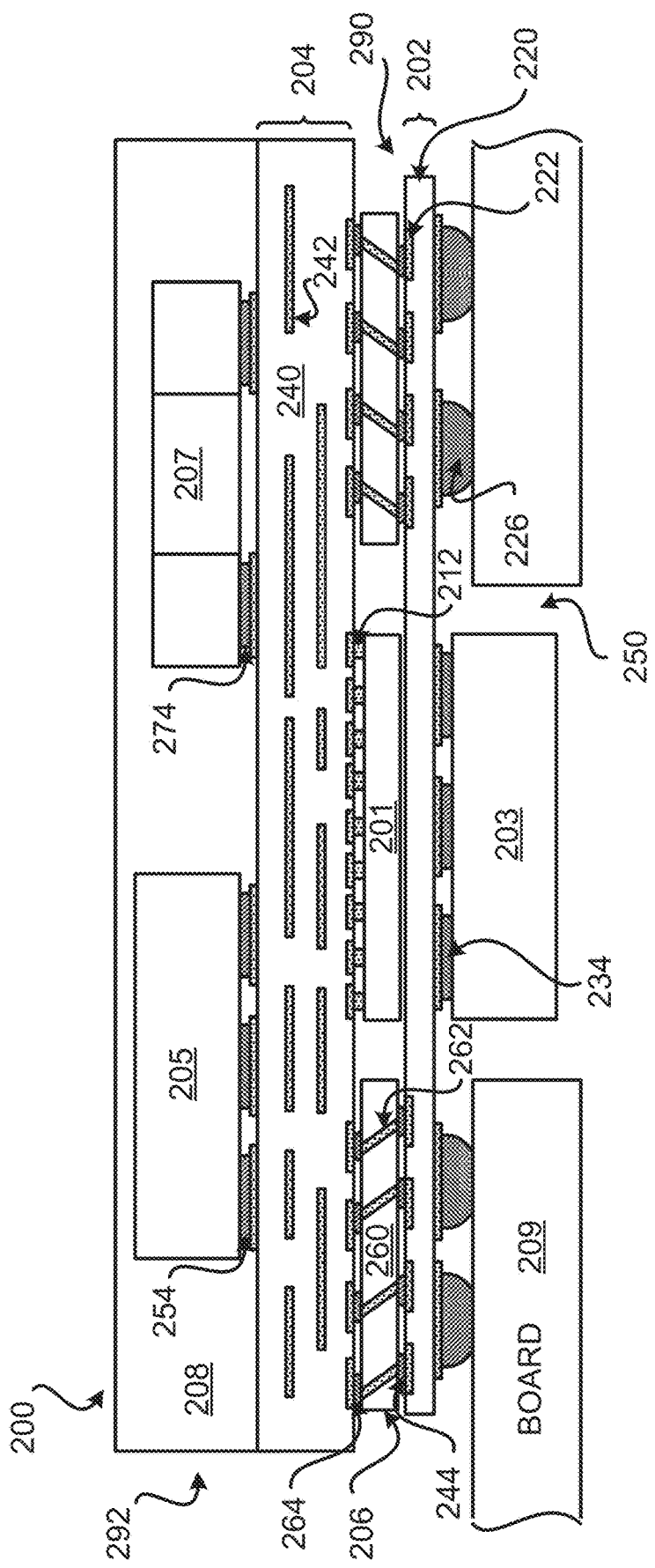
FIG. 2 illustrates a profile view of a package that includes gradient interconnects between substrates.

FIG. 2 illustrates a profile view of a device 200 that includes a gradient interconnect structure. The device 200 includes a first package 290 and a second package 292. The device 200 may include a package on package (PoP). The second package 292 is coupled to the first package 290. The device 200 is coupled to the board 209 through a plurality of solder interconnects 226. In particular, the first package 290 is coupled to the board 209 through the plurality of solder interconnects 226. The first package 290 is located between the second package 292 and the board 209. The board 209 may include a printed circuit board (PCB).

The first package 290 includes a first substrate 202, an integrated device 203, a gradient interconnect structure 206 and a plurality of solder interconnects 226. The first substrate 202 includes at least one dielectric layer 220 and a plurality of interconnects 222. The first substrate 202 may include an embedded trace substrate (ETS), a laminate substrate, and/or a coreless substrate. The integrated device 203 is coupled to a first surface (e.g., bottom surface) of the first substrate 202 through a plurality of solder interconnects 234. The plurality of solder interconnects 226 is coupled to the first surface of the first substrate 202.

The gradient interconnect structure 206 is coupled to a second surface (e.g., top surface) of the first substrate 202. A plurality of solder interconnects 244 may be used to couple the gradient interconnect structure 206 to the first substrate 202. The gradient interconnect structure 206 includes an encapsulation layer 260 and at least one interconnect 262 that extends though the encapsulation layer 260. The encapsulation layer 260 may be a means for encapsulation. A compression and transfer molding process, a sheet molding process, or a liquid molding process may be used to form the encapsulation layer 260. The at least one interconnect 262 may extend in the encapsulation layer 260 along different directions. Each of the at least one interconnect 262 may be a continuous interconnect that extends through the encapsulation layer 260. In the example of FIG. 2, the at least one interconnect 262 includes at least one continuous interconnect that extend diagonally in the encapsulation layer 260. The diagonally direction is relative to the surface of the encapsulation layer 260 that is facing and/or coupled to the first substrate 202. Examples of diagonal directions include for example between approximately 1 degree and 89 degrees (inclusive of any angles between 1 degree and 89 degrees). The at least one continuous interconnect may include lead frame interconnects. The at least one interconnect 262 is coupled to the first substrate 202 through the plurality of solder interconnects 244. The gradient interconnect structure 206 may be a means for gradient interconnection. As will be further described below in at least FIGS. 3-5, a gradient interconnect structure 206 may include interconnects with different shapes, dimensions, designs and/or directions. The use of the gradient interconnect structure 206 (and/or any of the gradient interconnect structures described in the disclosure) provides a thinner first substrate 202, which can translate into a thinner package on package (PoP). The gradient interconnect structure 206 may be located along a periphery of the first substrate 202.

As mentioned above, the second package 292 is coupled to the first package 290. The second package 292 includes a second substrate 204, an integrated device 201, an integrated device 205, a device 207 and an encapsulation layer 208. The second substrate 204 includes at least one dielectric layer 240 and a plurality of interconnects 242. The second substrate 204 may include an embedded trace substrate (ETS), a core substrate, a laminate substrate, and/or a coreless substrate. The integrated device 201 is coupled to a first surface (e.g., bottom surface) of the second substrate 204 through a plurality of pillar interconnects 212. The plurality of pillar interconnects 212 may be coupled to the plurality of interconnects 242 through a plurality of solder interconnects. The integrated device 205 is coupled to a second surface (e.g., top surface) of the second substrate 204 through a plurality of solder interconnects 254. The device 207 is coupled to the second surface of the second substrate 204 through a plurality of solder interconnects 274. The device 207 may include a passive device (e.g., surface mounted capacitor). The encapsulation layer 208 is formed over the second surface of the second substrate 204, the integrated device 205 and the device 207. The encapsulation layer 208 may be a means for encapsulation. A compression and transfer molding process, a sheet molding process, or a liquid molding process may be used to form the encapsulation layer 208.

The second substrate 204 is coupled to the gradient interconnect structure 206 through a plurality of solder interconnects 264. The plurality of interconnects 242 is coupled to the at least one interconnect 262 through the plurality of solder interconnects 264. The second substrate 204 is coupled to the first substrate 202 such that the gradient interconnect structure 206 is between the first substrate 202 and the second substrate 204. The second package 292 is coupled to the first package 290 such that the integrated device 201 is located laterally to the gradient interconnect structure 206. The gradient interconnect structure 206 may be located laterally around (e.g., laterally surround) the integrated device 201.

The device 200 is coupled to the board 209 such that the integrated device 203 is located (at least partially) in a cavity 250 of the board 209. The first substrate 202 includes a first width and/or a first length. The second substrate 204 includes a second width and/or a second length. The first width may be equal or less than the second width. The first length may be equal or less than the second length. However, as will be further illustrated and described below, the first width may be equal or greater than the second width, and/or the first length may be equal or greater than the second length.

An integrated device (e.g., 201, 203, 205) may include a die (e.g., semiconductor bare die). The integrated device may include a radio frequency (RF) device, a passive device, a filter, a capacitor, an inductor, an antenna, a transmitter, a receiver, a GaAs based integrated device, a surface acoustic wave (SAW) filters, a bulk acoustic wave (BAW) filter, a light emitting diode (LED) integrated device, a silicon (Si) based integrated device, a silicon carbide (SiC) based integrated device, processor, memory and/or combinations thereof. An integrated device (e.g., 201, 203, 205) may include at least one electronic circuit (e.g., first electronic circuit, second electronic circuit, etc. . . . ). A passive device may include a surface mounted device (SMD). A passive device may include a capacitor or a resistor.

The configurations and designs of the device 200 provide packages with a relatively low thickness, that is robust and reliable. In addition to the gradient interconnect structure 206 having a low thickness, the use of the gradient interconnect structure 206 may further reduce the thickness of the first package 290 because the first substrate 202 may require fewer metal layers.

Figure 3:
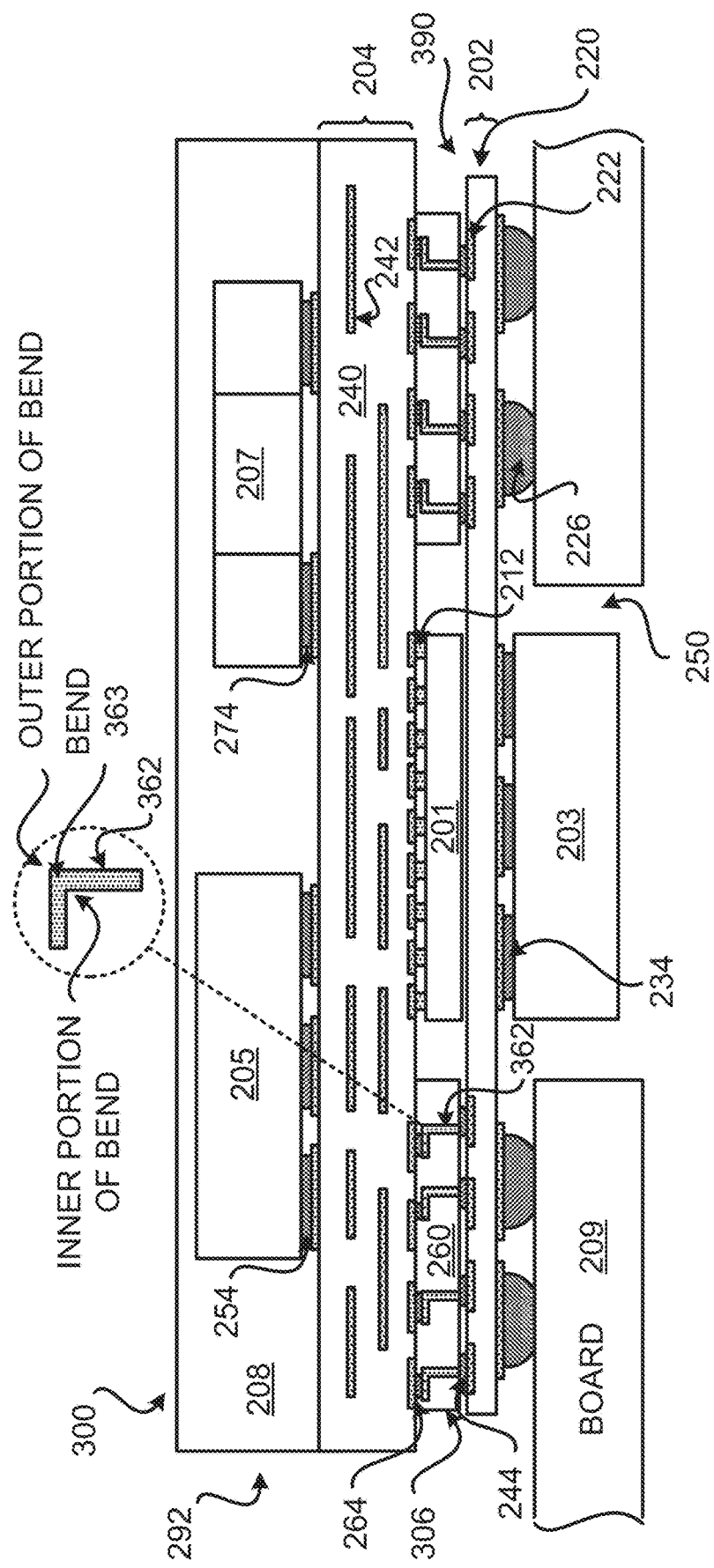
FIG. 3 illustrates a profile view of another package that includes gradient interconnects between substrates.

FIG. 3 illustrates a device 300 that includes a gradient interconnect structure. The device 300 is similar to the device 200, and thus may include the same or similar components as the device 200. The device 300 may include a package on package (PoP). The device includes a first package 390 and the second package 292. The second package 292 is coupled to the first package 390. The first package 390 is similar to the first package 290 and includes similar components and configurations as the first package 290. The first package 390 includes the first substrate 202, the integrated device 203 and a gradient interconnect structure 306. The gradient interconnect structure 306 is similar to the gradient interconnect structure 206. However, the gradient interconnect structure 306 includes interconnects with a different design and/or shape.

The gradient interconnect structure 306 is coupled to a second surface (e.g., top surface) of the first substrate 202. A plurality of solder interconnects 244 may be used to couple the gradient interconnect structure 306 to the first substrate 202. The gradient interconnect structure 306 includes the encapsulation layer 260 and at least one interconnect 362 that extends though the encapsulation layer 260. The at least one interconnect 362 include may extend in the encapsulation layer 260 along different directions. Each of the at least one interconnect 362 may be a continuous interconnect that extends through the encapsulation layer 260. In the example of FIG. 3, the at least one interconnect 362 includes at least one continuous interconnect that extends horizontally and vertically in the encapsulation layer 260. The at least one continuous interconnect may be an interconnect that has been bent to extend horizontally and vertically. The at least one interconnect 362 may have at least one bend 363. A bend (e.g., 363) may result in the continuous interconnect to be compressed in one corner of the bend and expanded in another corner of the bend. For example, an inner portion (e.g., inner corner) of the bend may be compressed, while an outer portion (e.g., outer corner) of the bend may be expanded. The compression and expansion of the various portions of the bend may be from the use of a stamping process that creates the form and shape of a lead frame interconnect. It is noted that the at least one continuous interconnect 362 may have more than one bend, and/or may extend in different directions and/or different combinations of directions. The at least one continuous interconnect may include lead frame interconnects. The at least one interconnect 362 is coupled to the first substrate 202 through the plurality of solder interconnects 244. The gradient interconnect structure 306 may be a means for gradient interconnection. The gradient interconnect structure 306 may be located along a periphery of the first substrate 202. The gradient interconnect structure 306 may be located laterally around (e.g., laterally surround) the integrated device 201.

Figure 4:
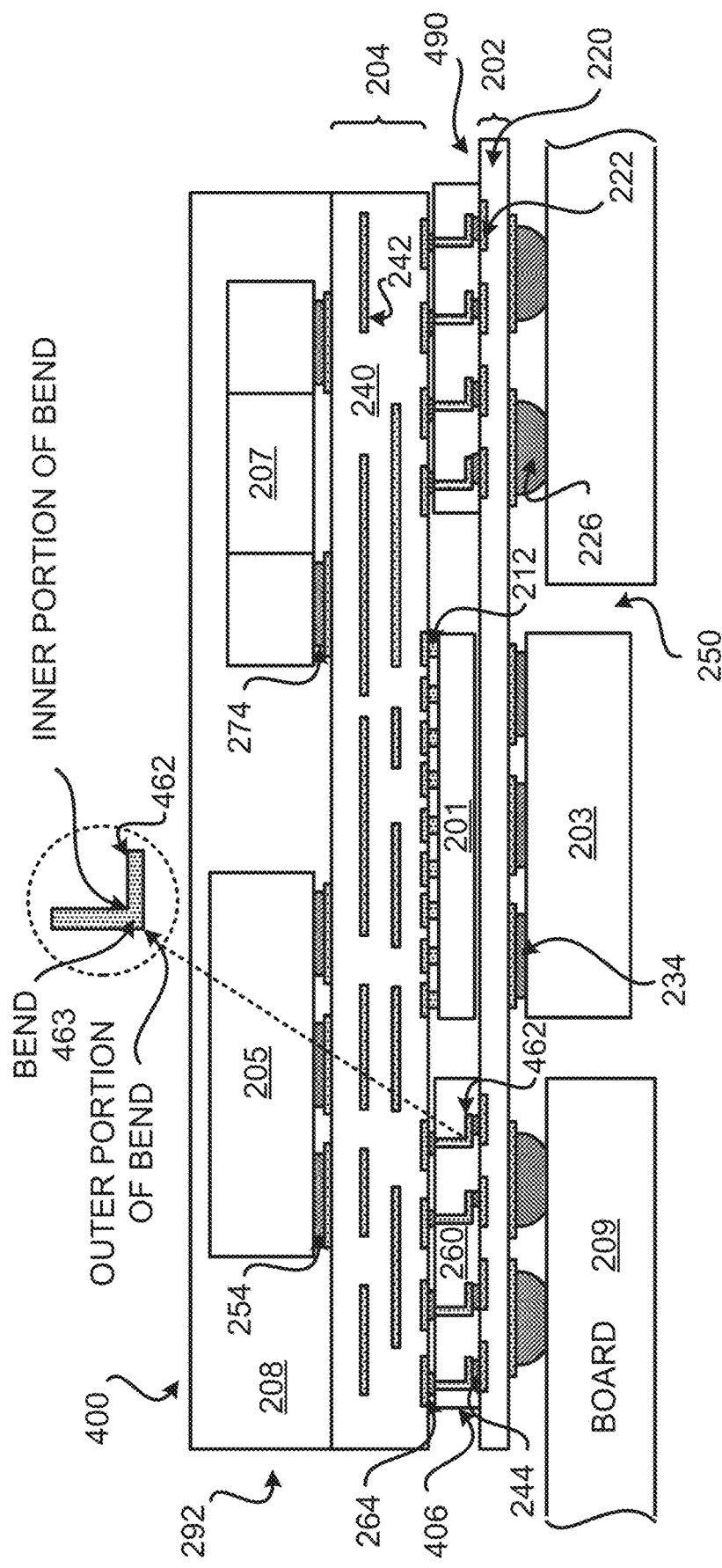
FIG. 4 illustrates a profile view of another package that includes gradient interconnects between substrates.

FIG. 4 illustrates a device 400 that includes a gradient interconnect structure. The device 400 is similar to the device 200, and thus may include the same or similar components as the device 200. The device 400 may include a package on package (PoP). The device includes a first package 490 and the second package 292. The second package 292 is coupled to the first package 490. The first package 490 is similar to the first package 290 and includes similar components and configurations as the first package 290. The first package 490 includes the first substrate 202, the integrated device 203 and a gradient interconnect structure 406. The gradient interconnect structure 406 is similar to the gradient interconnect structure 206. However, the gradient interconnect structure 406 includes interconnects with a different design and/or shape.

The gradient interconnect structure 406 is coupled to a second surface (e.g., top surface) of the first substrate 202. A plurality of solder interconnects 244 may be used to couple the gradient interconnect structure 406 to the first substrate 202. The gradient interconnect structure 406 includes the encapsulation layer 260 and at least one interconnect 462 that extends though the encapsulation layer 260. The at least one interconnect 462 include may extend in the encapsulation layer 260 along different directions. Each of the at least one interconnect 462 may be a continuous interconnect that extends through the encapsulation layer 260. In the example of FIG. 4, the at least one interconnect 462 includes at least one continuous interconnect that extend vertically and horizontally in the encapsulation layer 260. The at least one continuous interconnect may be an interconnect that has been bent to extend vertically and horizontally. The at least one interconnect 462 may have at least one bend 463. A bend (e.g., 463) may result in the continuous interconnect to be compressed in one corner of the bend and expanded in another corner of the bend. For example, an inner portion (e.g., inner corner) of the bend may be compressed, while an outer portion (e.g., outer corner) of the bend may be expanded. The compression and expansion of the various portions of the bend may be from the use of a stamping process that creates the form and shape of a lead frame interconnect. It is noted that the at least one continuous interconnect 362 may have more than one bend, and/or may extend in different directions and/or different combinations of directions. The at least one continuous interconnect may include lead frame interconnects. The at least one interconnect 462 is coupled to the first substrate 202 through the plurality of solder interconnects 244. The gradient interconnect structure 406 may be a means for gradient interconnection. The gradient interconnect structure 406 may be located along a periphery of the first substrate 202. The gradient interconnect structure 406 may be located laterally around (e.g., laterally surround) the integrated device 201.

The first substrate 202 includes a first width and/or a first length. The second substrate 204 includes a second width and/or a second length. The first width may be equal or greater than the second width. The first length may be equal or greater than the second length.

FIG. 5 illustrates a device 500 that includes a gradient interconnect structure. The device 500 is similar to the device 400, and thus may include the same or similar components as the device 400. The device 500 may include a package on package (PoP). The device includes a first package 590 and the second package 292. The second package 292 is coupled to the first package 590. The first package 590 is similar to the first package 490 and includes similar components and configurations as the first package 490. The first package 590 includes the first substrate 202, the integrated device 203, the gradient interconnect structure 406 and a gradient interconnect structure 506. The gradient interconnect structure 506 is similar to the gradient interconnect structure 406. However, the gradient interconnect structure 506 includes interconnects with a different design and/or shape. The gradient interconnect structure 506 includes an encapsulation layer 260 and at least one continuous interconnect that extends vertically through the encapsulation layer 260. The gradient interconnect structure 506 may be a means for gradient interconnection. The gradient interconnect structure 406 and/or the gradient interconnect structure 506 may be located along a periphery of the first substrate 202. The gradient interconnect structure 406 and the gradient interconnect structure 506 may be located laterally around (e.g., laterally surround) the integrated device 201.

A gradient interconnect structure as used in the disclosure includes a structure that includes at least one gradient interconnect. The gradient interconnect may be located in an encapsulation layer. A gradient interconnect may include a continuous interconnect that extends vertically, horizontally, and/or diagonally. The at least one continuous interconnect may have homogenous composition. The at least one continuous interconnect (e.g., 262, 362, 462, 562) that extends through an encapsulation layer may have the shape of a plate or strip of metal (e.g., rectangular bar, square bar). Thus, for example, the planar profile of a continuous interconnect (e.g., 262, 362, 462, 562) in an encapsulation layer may have the shape of rectangular (e.g., square). The planar profile of the continuous interconnect may be the profile at the top and/or bottom surface(s) of the encapsulation layer and/or along a plane (e.g., horizontal plane, X-Y plane) that is parallel to the top and/or bottom surface(s) of the encapsulation layer. A gradient interconnect may be formed from a lead frame (e.g., lead frame interconnect). A gradient interconnect may include at least one bend (e.g., one or more bends) in the continuous interconnect. A bend may result in the continuous interconnect to be compressed (e.g., denser) in one corner of the bend and expanded (e.g., less dense) in another corner of the bend. For example, an inner portion (e.g., inner corner) of the bend may be compressed, while an outer portion (e.g., outer corner) of the bend may be expanded. The inner portion of the bend may be more compressed (e.g., more dense) relative to the non-bent portion of the continuous interconnect. The outer portion of the bend may be less compressed (e.g., less dense) relative to the non-bent portion of the continuous interconnect. The compression and expansion of the various portions of the bend may be from the use of a stamping process that creates the form and shape of a lead frame interconnect. It is noted that the at least one continuous interconnect (e.g., 262, 362, 462, 562) of a gradient interconnect may have more than one bend, and/or may extend in different directions and/or different combinations of directions. For example, at least one continuous interconnect may extend in a combination of vertical, horizontal and/or diagonal directions. In some implementations, at least one continuous interconnect may extend in different diagonal directions. For example, a first continuous interconnect may extend in a first diagonal direction, while a second continuous interconnect may extend in a second diagonal direction. A continuous interconnect may extend in multiple different diagonal directions.

Having described various packages and gradient interconnect structures with an improved configuration, a sequence for fabricating a gradient interconnect structure will now be described below.

Exemplary Sequence for Fabricating a Gradient Interconnect Structure

Figure 6B:
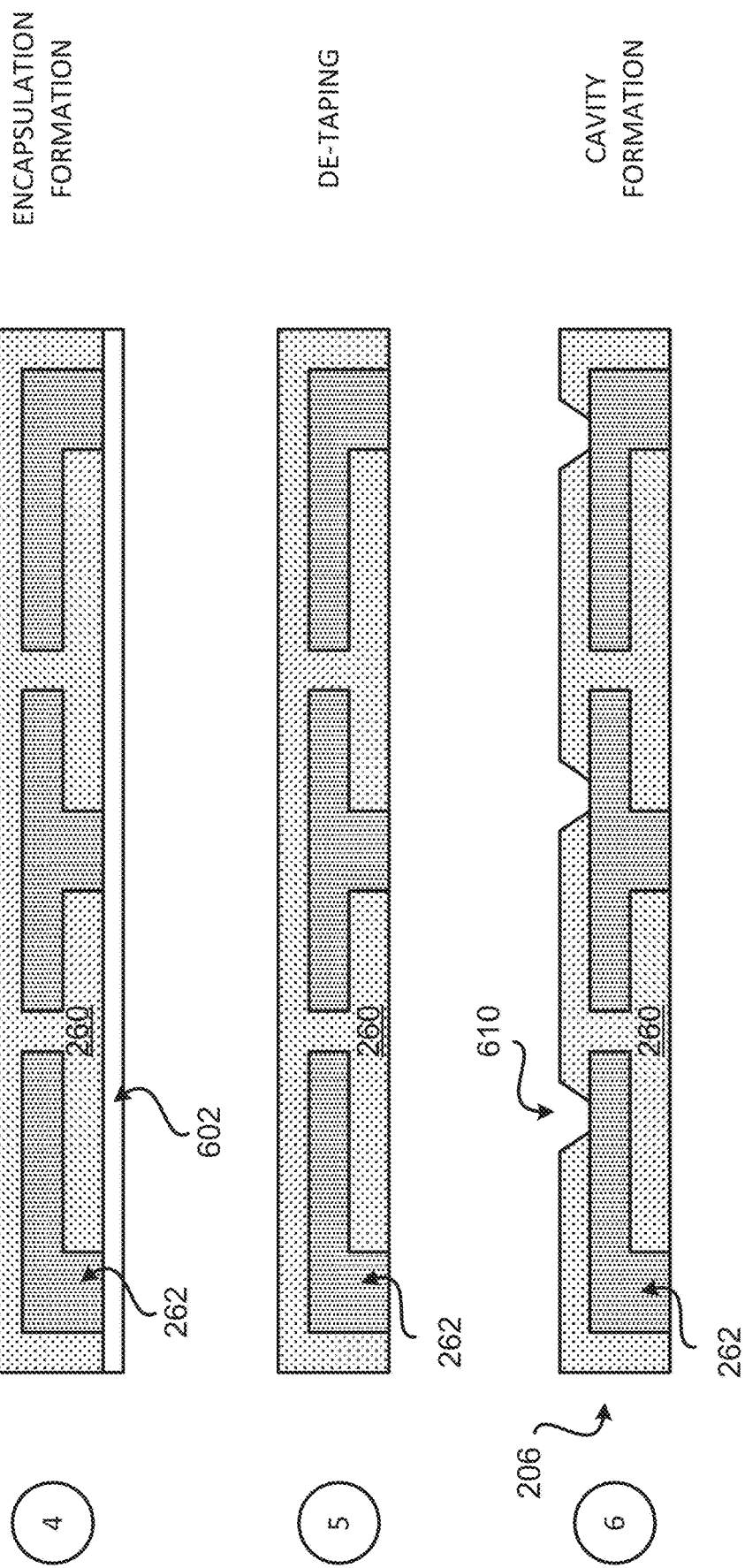

FIGS. 6A-6B illustrate an exemplary sequence for providing or fabricating a gradient interconnect structure. In some implementations, the sequence of FIGS. 6A-6B may be used to provide or fabricate a gradient interconnect structure 206, or any of the gradient interconnect structures described in the disclosure.

It should be noted that the sequence of FIGS. 6A-6B may combine one or more stages in order to simplify and/or clarify the sequence for providing or fabricating a gradient interconnect structure. In some implementations, the order of the processes may be changed or modified. In some implementations, one or more of processes may be replaced or substituted without departing from the spirit of the disclosure. Different implementations may fabricate a gradient interconnect structure differently.

Stage 1, as shown in FIG. 6A, illustrates a state after a conductive material 600 is provided. The conductive material 600 includes an electrically conductive material (e.g., metal, copper). The conductive material 600 may include a sheet of conductive material (e.g., sheet of metal).

Stage 2 illustrates a state after the conductive material 600 is etched and/or stamped to form a lead frame interconnect 262. The lead frame interconnect 262 may have different shapes, angles and/or dimensions. The lead frame interconnect 262 may include various continuous interconnects. The various continuous interconnects may have different shapes, angles, and/or dimensions.

Stage 3 illustrates a state after the lead frame interconnect 262 is coupled to a tape 602 (e.g., adhesive).

Stage 4, as shown in FIG. 6B, illustrates a state after an encapsulation layer 260 is formed over the tape 602 and the lead frame interconnect 262. The encapsulation layer 260 encapsulates the lead frame interconnect 262. A compression and transfer molding process, a sheet molding process, or a liquid molding process may be used to form the encapsulation layer 260.

Stage 5, illustrates a state after the tape 602 is decoupled from the lead frame interconnect 262 and the encapsulation layer 260.

Stage 6 illustrates a state after at least one cavity 610 is formed in the encapsulation layer 260. A laser process and/or an etching process may be used to form the cavity 610. The cavity 610 may expose part(s) of the lead frame interconnect 262. The cavity 610 may include solder interconnects when the gradient interconnect structure is coupled to substrates. In some implementations, Stage 6 may illustrate a gradient interconnect structure 206. It is noted that the structure of Stage 6 may be singulated into smaller individual gradient interconnect structures.

Figure 7:
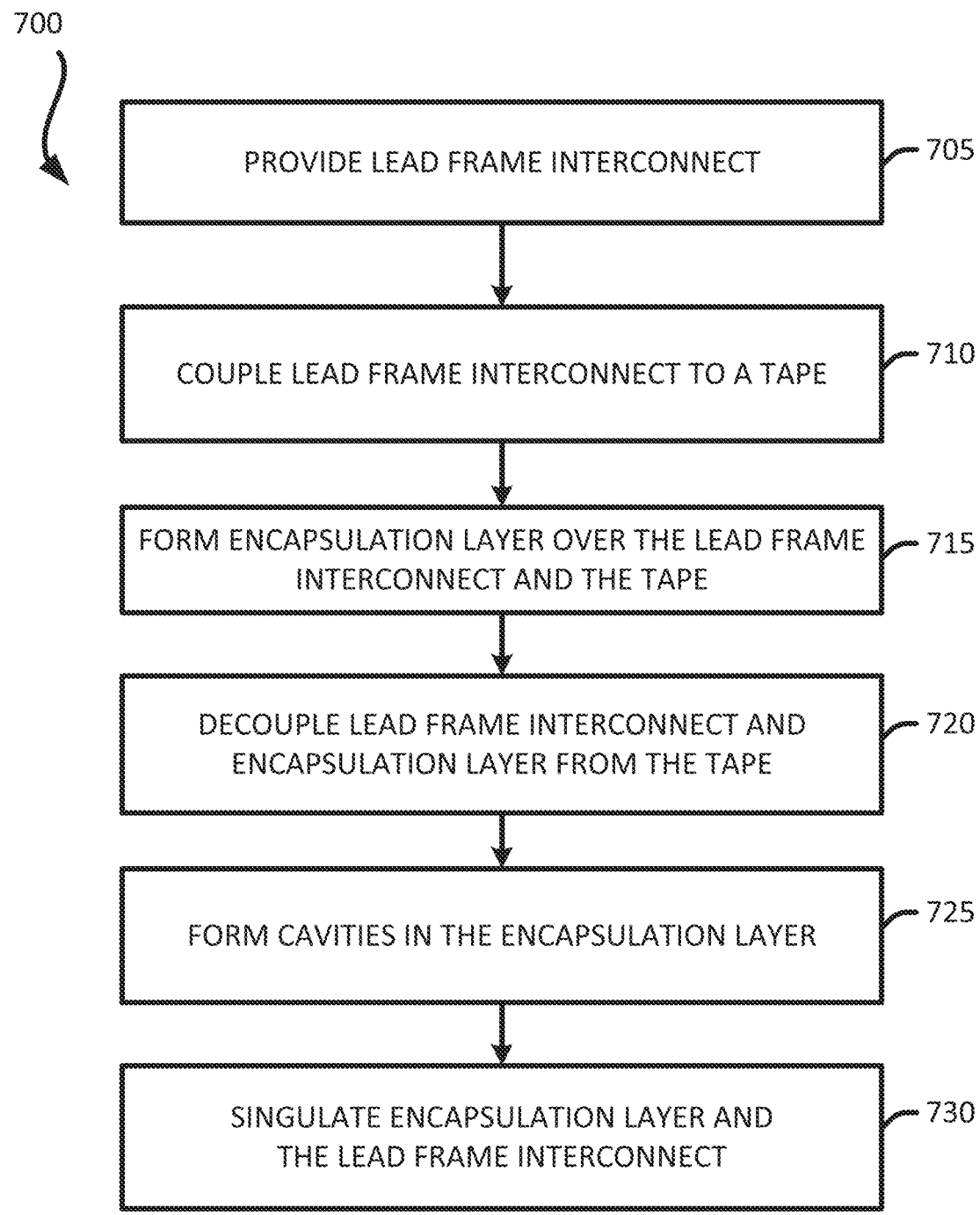
FIG. 7 illustrates an exemplary flow diagram of a method for fabricating gradient interconnects.

Exemplary Flow Diagram of a Method for Fabricating a Gradient Interconnect Structure In some implementations, fabricating a package with a gradient interconnect structure includes several processes. FIG. 7 illustrates an exemplary flow diagram of a method 700 for providing or fabricating a gradient interconnect structure. In some implementations, the method 700 of FIG. 7 may be used to provide or fabricate the gradient interconnect structure of FIG. 2. However, the method of FIG. 7 may be used fabricate any gradient interconnect structure in the disclosure.

It should be noted that the method of FIG. 7 may combine one or more processes in order to simplify and/or clarify the method for providing or fabricating a package. In some implementations, the order of the processes may be changed or modified.

The method provides (at 705) provides a lead frame interconnects (e.g., 262). Providing a lead frame interconnect may include providing a conductive material 600. The conductive material 600 includes an electrically conductive material (e.g., metal, copper). Stage 1 of FIG. 6A illustrates and describes an example of providing an electrically conductive material. Providing a lead frame interconnect may include using a stamping process and/or etching process to form the various interconnects (e.g., continuous interconnects). The lead frame interconnect 262 may have different shapes, sizes and/or configurations. Stage 2 of FIG. 6A illustrates and describes an example of a state after the conductive material 600 is etched and/or stamped to form a lead frame interconnect.

The method couples (at 710) the lead frame interconnect to an adhesive (e.g., 602). Stage 3 of FIG. 6A illustrates and describes an example of a lead frame interconnect coupled to a tape (e.g., adhesive).

The method forms (at 715) an encapsulation layer (e.g. 260) over the tape 602 and the lead frame interconnect 262. The encapsulation layer 260 encapsulates the lead frame interconnect 262. A compression and transfer molding process, a sheet molding process, or a liquid molding process may be used to form the encapsulation layer 260. Stage 4 of FIG. 6B illustrates and describes an example of forming an encapsulation layer.

The method decouples (at 720) the tape (e.g., 602) from the lead frame interconnect 262 and the encapsulation layer 260. Stage 5 of FIG. 6B illustrates and describes an example of a tape that has been decoupled from a lead frame interconnect and an encapsulation layer.

The method forms (at 725) at least one cavity (e.g., 610) in the encapsulation layer 260. A laser process and/or an etching process may be used to form the cavity. The cavity in the encapsulation layer may expose portions of the lead frame interconnect 262. Stage 6 of FIG. 6B illustrates and describes an example of a least one cavity that is formed in the encapsulation layer.

The method may singulate (at 730) the encapsulation layer (e.g. 260) and the lead frame interconnect (e.g., 262) to form several gradient interconnect structures. A mechanical process (e.g., sawing process) may be used to singulate the encapsulation layer and the lead frame interconnect.

Figure 8A:
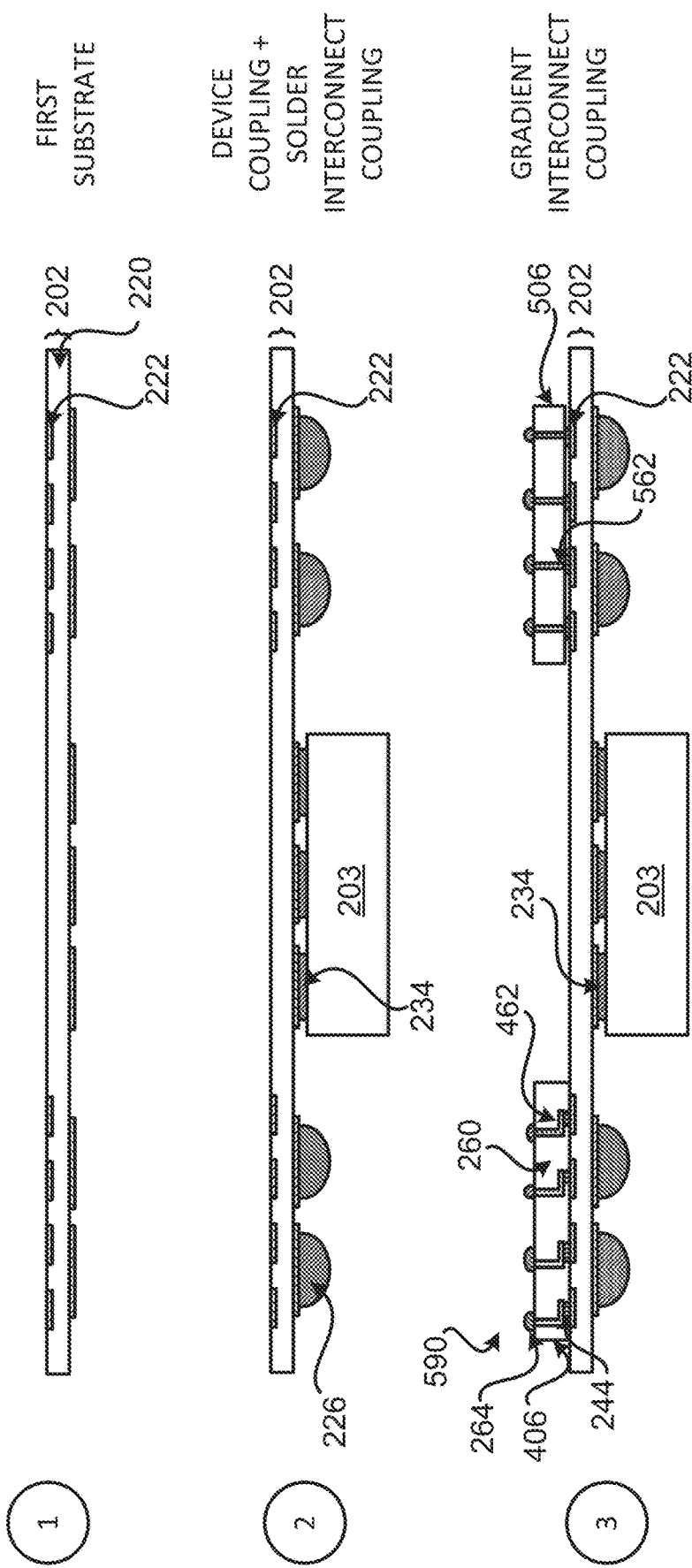
Figure 8B:
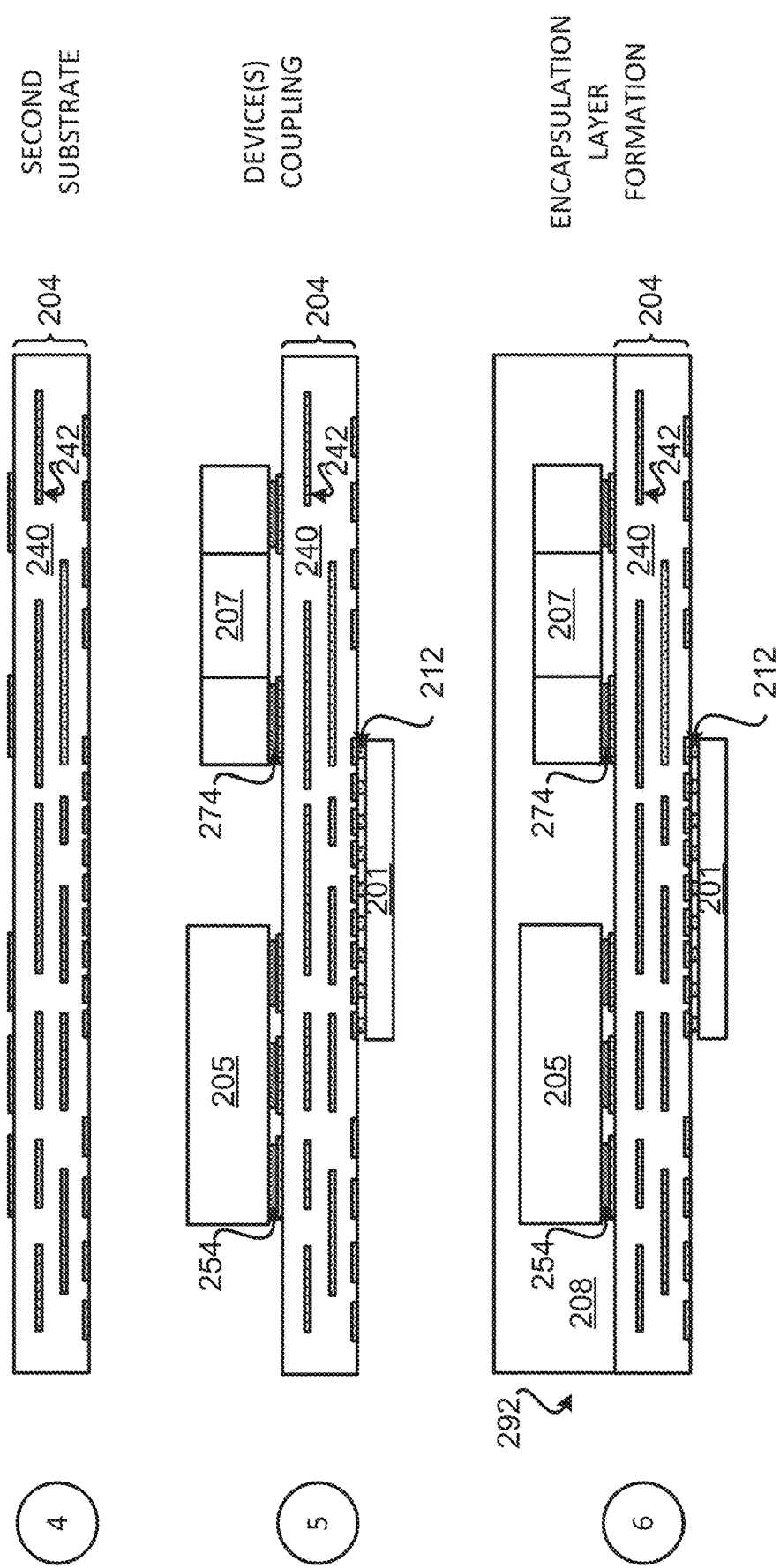

Exemplary Sequence for Fabricating a Package Comprising a Gradient Interconnect Structure FIGS. 8A-8C illustrate an exemplary sequence for providing or fabricating a package that includes a gradient interconnect structure. In some implementations, the sequence of FIGS. 8A-8C may be used to provide or fabricate a substrate, which can then be implemented in the device and package of FIG. 5, or any of the devices and packages described in the disclosure.

It should be noted that the sequence of FIGS. 8A-8C may combine one or more stages in order to simplify and/or clarify the sequence for providing or fabricating a device. In some implementations, the order of the processes may be changed or modified. In some implementations, one or more of processes may be replaced or substituted without departing from the spirit of the disclosure. Different implementations may fabricate a device differently.

Stage 1, as shown in FIG. 8A, illustrates a state after a first substrate 202 is provided. The first substrate 202 includes at least one dielectric layer 220 and a plurality of interconnects 222. The first substrate 202 may include different numbers of metal layers. The first substrate 202 may include a laminated substrate and/or a coreless substrate (e.g., ETS).

Stage 2 illustrates a state after the integrated device 203 is coupled to a first surface (e.g., bottom surface) of the first substrate 202. The integrated device 203 may be coupled to the first substrate 202 through a plurality of solder interconnects 234. Stage 2 also illustrates a plurality of solder interconnects 226 that is coupled to the first surface of the first substrate 202. One or more solder reflow processes may be used to couple to the plurality of solder interconnects 226 and to couple the integrated device 203 to the first substrate 202.

Stage 3 illustrates a state after a gradient interconnect structure 406 is coupled to a second surface (e.g., top surface) of the first substrate 202. Stage 3 also illustrates a state after a gradient interconnect structure 506 is coupled to the second surface of the first substrate 202. Stage 3 may illustrate the first package 590 that includes the first substrate 202, the integrated device 203, the gradient interconnect structure 406 and the gradient interconnect structure 506. The gradient interconnect structure 406 is coupled to the first substrate 202 through the plurality of solder interconnects 244. The gradient interconnect structure 406 includes the encapsulation layer 260 and the plurality of interconnects 462. The plurality of interconnects 462 may include lead frame interconnects. The plurality of interconnects 462 may include continuous interconnects that extend in different directions (e.g., vertically, horizontally, diagonally) and/or different combinations of directions (e.g., vertically, horizontally, diagonally). A plurality of solder interconnects 264 may be coupled to the gradient interconnect structure 406. The gradient interconnect structure 506 includes an encapsulation layer (e.g., 260) and a plurality of interconnects 562. The gradient interconnect structure 406 and the gradient interconnect structure 506 may be fabricated using the same process (or a similar process) as described in FIGS. 6A-6B for the gradient interconnect structure 206.

Stage 4, as shown in FIG. 8B, illustrates a state after a second substrate 204 is provided. The second substrate 204 includes at least one dielectric layer 240 and a plurality of interconnects 242. The second substrate 204 may include different numbers of metal layers. The second substrate 204 may include a laminated substrate, a core substrate and/or a coreless substrate (e.g., ETS).

Stage 5 illustrates a state after the integrated device 201 is coupled to a first surface (e.g., bottom surface) of the second substrate 204. The integrated device 201 may be coupled to the second substrate 204 through a plurality of pillar interconnects 212 and/or solder interconnects. Stage 5 also illustrates a state after the integrated device 205 is coupled to a second surface (e.g., top surface) of the second substrate 204, and the device 207 is coupled to the second surface of the second substrate 204. The integrated device 205 may be coupled to the second substrate 204 through a plurality of solder interconnects 254. The device 207 (e.g., passive device) may be coupled to the second substrate 204 through a plurality of solder interconnects 274. One or more solder reflow processes may be used to couple the integrated device 205 and the device 207 to the second substrate 204.

Stage 6 illustrates a state after an encapsulation layer 208 is formed over the second substrate 204, the integrated device 205 and the device 207. The encapsulation layer 208 encapsulates the integrated device 205 and the device 207. A compression and transfer molding process, a sheet molding process, or a liquid molding process may be used to form the encapsulation layer 208. Stage 6 may illustrate the second package 292.

Stage 7, as shown in FIG. 8C, illustrates a state after the second package 292 is coupled to the first package 590. One or more solder reflow processes may be used to couple the second package 292 to the first package 590. The second package 292 may be located over the first package 590. The second substrate 204 may be coupled to the first substrate 202 through the gradient interconnect structure 406 and the gradient interconnect structure 506. The integrated device 201 may be laterally surrounded by the gradient interconnect structure 406 and the gradient interconnect structure 506. The gradient interconnect structure 406 and the gradient interconnect structure 506 may be located between the first substrate 202 and the second substrate 204. The gradient interconnect structure 406 may be coupled to the second substrate 204 through the plurality of solder interconnects 264. Stage 7 may illustrate the device 500 that includes the first package 590 and the second package 292. The device 500 may include package on package (PoP).

Stage 8 illustrates a state after the device 500 is coupled to a board 209 through the plurality of solder interconnects 226. The device 500 is coupled to the board 209 such that the integrated device 203 is located at least partially in the cavity 250 of the board 209. A solder reflow process may be used to couple the device 500 to the board 209.

Exemplary Flow Diagram of a Method for Fabricating a Package Comprising a Gradient Interconnect Structure In some implementations, fabricating a package with a gradient interconnect structure includes several processes.

Figure 9:
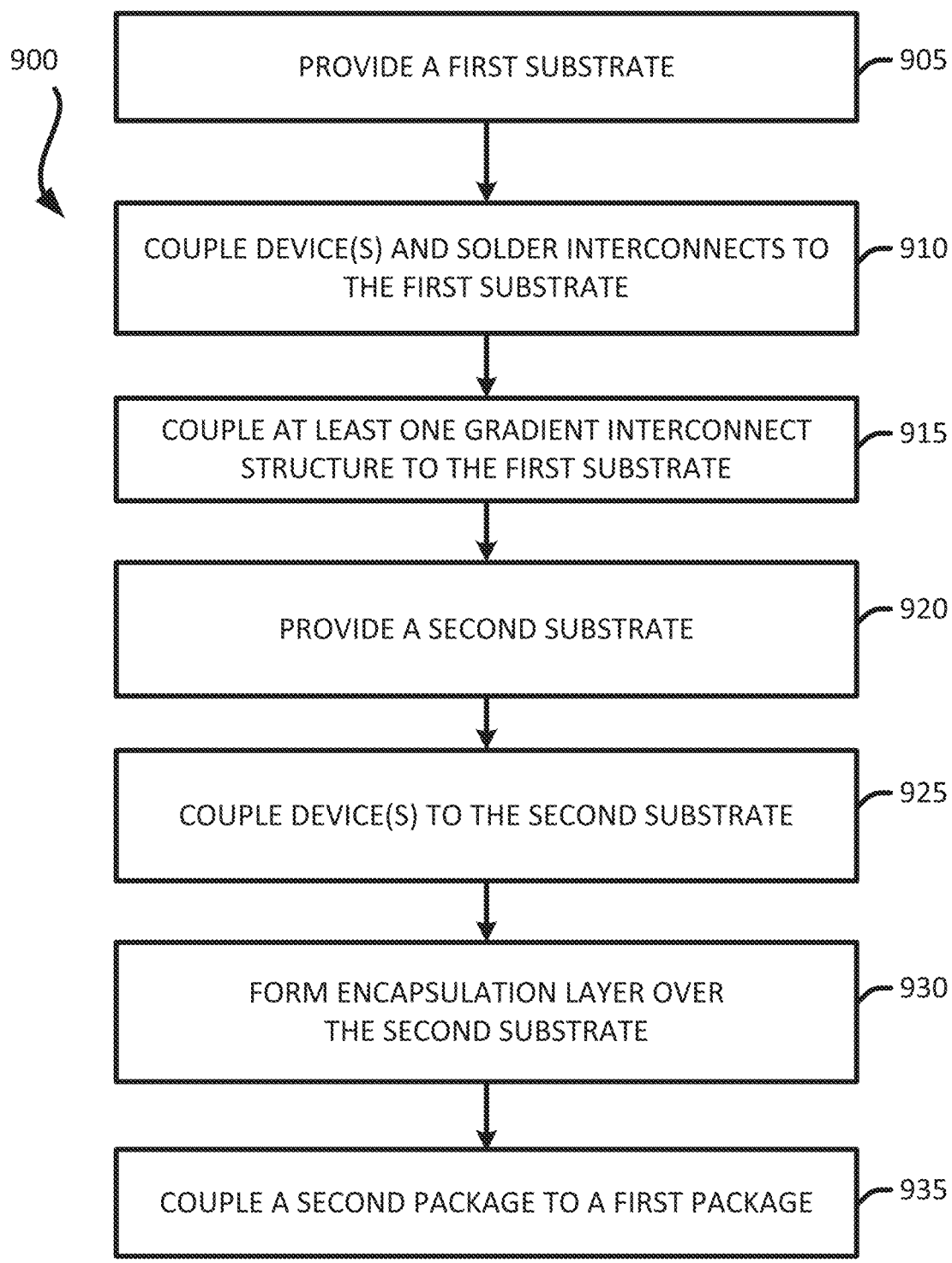
FIG. 9 illustrates an exemplary flow diagram of a method for fabricating a package that includes gradient interconnects between substrates.

FIG. 9 illustrates an exemplary flow diagram of a method 900 for providing or fabricating a package that includes a gradient interconnect structure. In some implementations, the method 900 of FIG. 9 may be used to provide or fabricate the device with a gradient interconnect structure of FIG. 5. For example, the method of FIG. 9 may be used to fabricate the device 500. However, the method of FIG. 9 may be used fabricate any device and/or packages in the disclosure.

It should be noted that the method of FIG. 9 may combine one or more processes in order to simplify and/or clarify the method for providing or fabricating a device and/or a package. In some implementations, the order of the processes may be changed or modified.

The method provides (at 905) a first substrate (e.g., 202). The first substrate 202 includes at least one dielectric layer 220 and a plurality of interconnects 222. The first substrate 202 may include different numbers of metal layers. The first substrate 202 may include a laminated substrate and/or a coreless substrate (e.g., ETS). Stage 1 of FIG. 8A, illustrates and describes an example of providing a first substrate.

The method couples (at 910) integrated devices (e.g., 203) and solder interconnects to the first substrate 202. The integrated device 203 may be coupled to the first substrate 202 through a plurality of solder interconnects 234. A plurality of solder interconnects 226 may be coupled to the first surface of the first substrate 202. One or more solder reflow processes may be used to couple to the plurality of solder interconnects 226 and to couple the integrated device 203 to the first substrate 202. Stage 2 of FIG. 8A, illustrates and describes an example of coupling an integrated device to a first substrate.

The method couples (at 915) at least one gradient interconnect structure (e.g., 406, 506) to the first substrate (e.g., 202). The gradient interconnect structure (e.g., 406, 506) may be coupled to the first substrate 202 through a plurality of solder interconnects (e.g., 244). The gradient interconnect structure 406 includes the encapsulation layer 260 and the plurality of interconnects 462. The plurality of interconnects 462 may include lead frame interconnects. The plurality of interconnects 462 may include continuous interconnects that extend in different directions (e.g., vertically, horizontally, diagonally) and/or different combinations of directions (e.g., vertically, horizontally, diagonally). A plurality of solder interconnects 264 may be coupled to the gradient interconnect structure 406. The gradient interconnect structure 506 includes an encapsulation layer (e.g., 260) and a plurality of interconnects 562. The gradient interconnect structure 406 and the gradient interconnect structure 506 may be fabricated using the same process (or a similar process) as described in FIGS. 6A-6B for the gradient interconnect structure 206. Stage 3 of FIG. 8A illustrates and describes an example of a gradient interconnect structure 406 coupled to a first substrate.

The method provides (at 920) a second substrate (e.g., 204). The second substrate 204 includes at least one dielectric layer 240 and a plurality of interconnects 242. The second substrate 204 may include different numbers of metal layers. The second substrate 204 may include a laminated substrate, a core substrate and/or a coreless substrate (e.g., ETS). Stage 4 of FIG. 8B, illustrates and describes a state after a second substrate 204 is provided.

The method couples (at 925) at least one device (e.g., 201, 205, 207) to the second substrate (e.g., 204). For example, an integrated device 201 may be coupled to the second substrate 204 through a plurality of pillar interconnects 212 and/or solder interconnects. One or more solder reflow processes may be used to couple the device(s) to the second substrate 204. Stage 5 of FIG. 8C, illustrates and describes an example of devices coupled to a second substrate.

The method forms (at 930) an encapsulation layer (e.g., 208) over the second substrate (e., 204). The encapsulation layer 208 may be formed over one or more devices (e.g., 205, 207). A compression and transfer molding process, a sheet molding process, or a liquid molding process may be used to form the encapsulation layer 208. Stage 6 of FIG. 8B, illustrates and describes an example of forming an encapsulation layer over a second substrate and device(s).

The method couples (at 935) a second package (e.g., 292) to a first package (e.g., 290, 390, 490, 590). One or more solder reflow processes may be used to couple the second package (e.g., 290) to the first package (e.g., 590). The second package 292 may be located over the first package 590. The second substrate 204 may be coupled to the first substrate 202 through the gradient interconnect structure 406 and the gradient interconnect structure 506. The integrated device 201 may be laterally surrounded by the gradient interconnect structure 406 and the gradient interconnect structure 506. The gradient interconnect structure 406 and the gradient interconnect structure 506 may be located between the first substrate 202 and the second substrate 204. The gradient interconnect structure 406 may be coupled to the second substrate 204 through the plurality of solder interconnects 264. Stage 7 of FIG. 8C, illustrates and describes an example of a second package coupled to a first package.

Exemplary Electronic Devices

Figure 10:
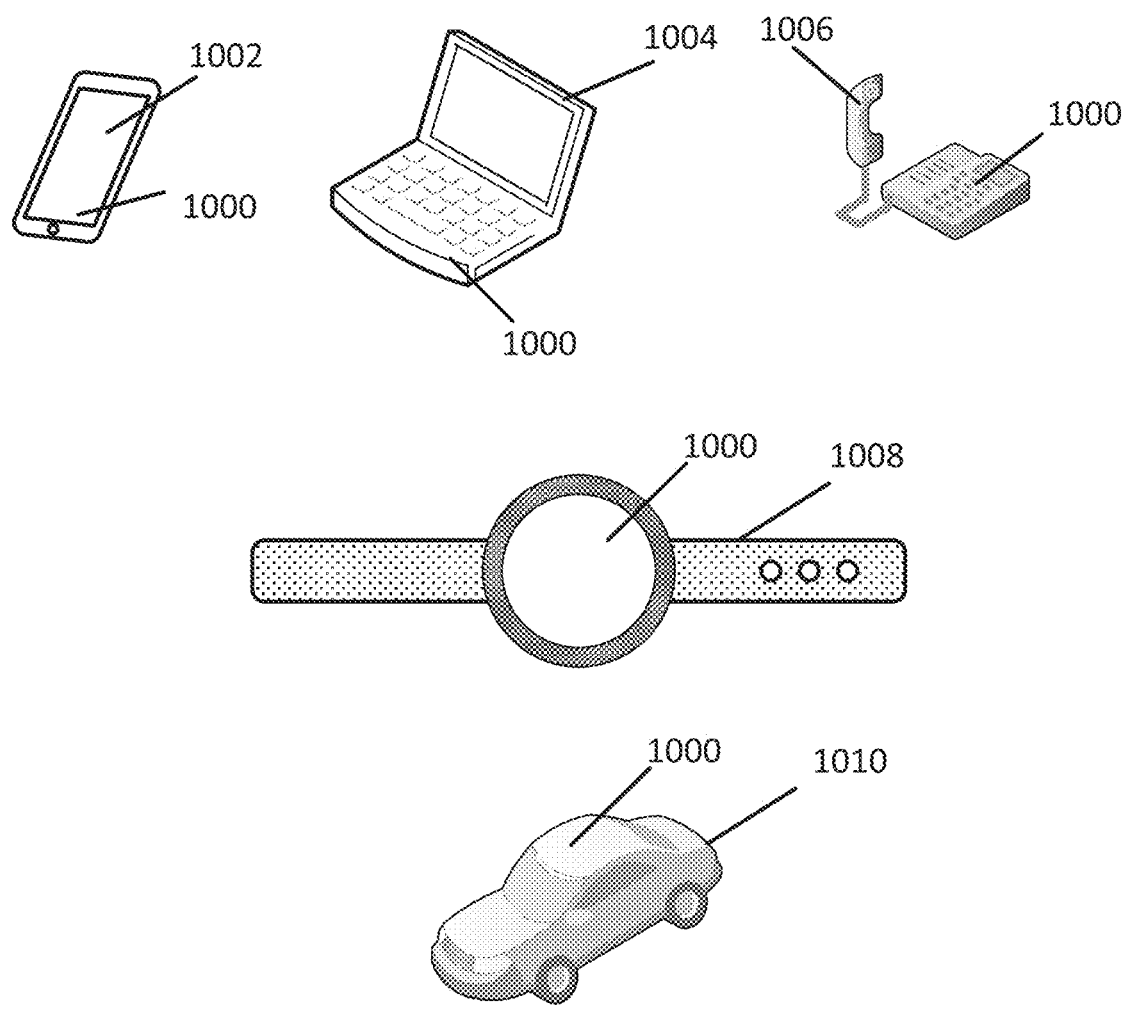
FIG. 10 illustrates various electronic devices that may integrate a die, an electronic circuit, an integrated device, an integrated passive device (IPD), a passive component, a package, and/or a device package described herein.

FIG. 10 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1002, a laptop computer device 1004, a fixed location terminal device 1006, a wearable device 1008, or automotive vehicle 1010 may include a device 1000 as described herein. The device 1000 may be, for example, any of the devices and/or integrated circuit (IC) packages described herein. The devices 1002, 1004, 1006 and 1008 and the vehicle 1010 illustrated in FIG. 10 are merely exemplary. Other electronic devices may also feature the device 1000 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-5, 6A-6B, 7, 8A-8C and/or 9-10 may be rearranged and/or combined into a single component, process, feature or function or embodied in several components, processes, or functions. Additional elements, components, processes, and/or functions may also be added without departing from the disclosure. It should also be noted FIGS. 2-5, 6A-6B, 7, 8A-8C and/or 9-10 and its corresponding description in the present disclosure is not limited to dies and/or ICs. In some implementations, FIGS. 2-5, 6A-6B, 7, 8A-8C and/or 9-10 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a signal (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

According to a first aspect, a device that includes a first package and a second package. The first package includes a first substrate, at least one gradient interconnect structure coupled to the first substrate, and a first integrated device coupled to the first substrate. The second package is coupled to the first package. The second package includes a second substrate, wherein the second substrate is coupled to the at least one gradient interconnect structure. The second package includes a second integrated device coupled to the second substrate. The gradient interconnect structure may be located between the first substrate and the second substrate. The gradient interconnect structure may include an encapsulation layer and at least one continuous interconnect that extends diagonally through the encapsulation layer. The gradient interconnect structure may include an encapsulation layer and at least one continuous interconnect that extends vertically and horizontally through the encapsulation layer. The at least one continuous interconnect that extends vertically and horizontally through the encapsulation layer, includes a lead frame interconnect. The gradient interconnect structure may be coupled to the first substrate through a first plurality of solder interconnects. The gradient interconnect structure may be coupled to the second substrate through a second plurality of solder interconnects. The device may include a package on package (PoP). The first substrate may have a first width, and the second substrate may have a second width that is equal or less than the first width. The first substrate may have a first width, and the second substrate may have a second width that is greater than the first width. The device may be selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

According to a second aspect, an apparatus that includes a first package and a second package. The first package includes a first substrate, means for gradient interconnection coupled to the first substrate, and a first integrated device coupled to the first substrate. The second package is coupled to the first package. The second package includes a second substrate, wherein the second substrate is coupled to the means for gradient interconnection. The second package includes a second integrated device coupled to the second substrate. The means for gradient interconnection may be located between the first substrate and the second substrate. The means for gradient interconnection may include an encapsulation layer, and at least one continuous interconnect that extends diagonally through the encapsulation layer. The means for gradient interconnection may include an encapsulation layer and at least one continuous interconnect that extends vertically and horizontally through the encapsulation layer. The at least one continuous interconnect that extends vertically and horizontally through the encapsulation layer, includes a lead frame interconnect. The means for gradient interconnection may be coupled to the first substrate through a first plurality of solder interconnects. The means for gradient interconnection may be coupled to the second substrate through a second plurality of solder interconnects. The device includes a package on package (PoP). The first substrate may have a first width, and the second substrate may have a second width that is equal or less than the first width. The first substrate may have a first width, and the second substrate may have a second width that is greater than the first width. The apparatus may be selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

According to a third aspect, a method for fabricating a device is provided. The method provides a first package comprising a first substrate, at least one gradient interconnect structure coupled to the first substrate, and a first integrated device coupled to the first substrate. The method couples a second package to the first package. The second package includes a second substrate, wherein the second substrate is coupled to the at least one gradient interconnect structure. The second package includes a second integrated device coupled to the second substrate. The gradient interconnect structure may be located between the first substrate and the second substrate. The gradient interconnect structure includes an encapsulation layer and at least one continuous interconnect that extends diagonally through the encapsulation layer. The gradient interconnect structure includes an encapsulation layer and at least one continuous interconnect that extends vertically and horizontally through the encapsulation layer. The at least one continuous interconnect that extends vertically and horizontally through the encapsulation layer, includes a lead frame interconnect. The gradient interconnect structure may be coupled to the first substrate through a first plurality of solder interconnects. The gradient interconnect structure may be coupled to the second substrate through a second plurality of solder interconnects. The first substrate may have a first width. The second substrate may have a second width that is equal or less than the first width. The first substrate may have a first width. The second substrate may have a second width that is greater than the first width

The invention claimed is:

1. A device comprising:
   a first package comprising:
      a first substrate;
      at least one gradient interconnect structure coupled to the first substrate, wherein the at least one gradient interconnect structure includes a first gradient interconnect structure that comprises:
         an encapsulation layer; and
         at least one continuous interconnect that extends diagonally through the encapsulation layer; and
      a first integrated device coupled to the first substrate; and
   a second package coupled to the first package, the second package comprising:
      a second substrate, wherein the second substrate is coupled to the at least one gradient interconnect structure; and
      a second integrated device coupled to the second substrate.

2. The device of claim 1, wherein the gradient interconnect structure is located between the first substrate and the second substrate.

3. The device of claim 1, wherein the at least one gradient interconnect structure comprises a second gradient interconnect structure that includes:
   a second encapsulation layer; and
   at least one continuous second interconnect that extends diagonally through the second encapsulation layer.

4. The device of claim 1, wherein the at least one gradient interconnect structure comprises a second gradient interconnect structure that includes:
   a second encapsulation layer; and
   at least one continuous second interconnect that extends vertically and horizontally through the second encapsulation layer.

5. The device of claim 4, wherein the at least one continuous second interconnect that extends vertically and horizontally through the second encapsulation layer, includes a lead frame interconnect.

6. The device of claim 1,
   wherein the first gradient interconnect structure is coupled to the first substrate through a first plurality of solder interconnects; and
   wherein the first gradient interconnect structure is coupled to the second substrate through a second plurality of solder interconnects.

7. The device of claim 1, wherein the device includes a package on package (PoP).

8. The device of claim 1,
   wherein the first substrate has a first width, and wherein the second substrate has a second width that is equal or less than the first width.

9. The device of claim 1,
wherein the first substrate has a first width, and
wherein the second substrate has a second width that is greater than the first width.

10. The device of claim 1, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

11. An apparatus comprising:
a first package comprising:
a first substrate;
means for gradient interconnection coupled to the first substrate, wherein the means for gradient interconnection comprises:
an encapsulation layer; and
at least one continuous interconnect that extends vertically and horizontally through the encapsulation layer; and
a first integrated device coupled to the first substrate; and
a second package coupled to the first package, the second package comprising:
a second substrate, wherein the second substrate is coupled to the means for gradient interconnection; and
a second integrated device coupled to the second substrate.

12. The apparatus of claim 11, wherein the means for gradient interconnection is located between the first substrate and the second substrate.

13. The apparatus of claim 11, wherein the means for gradient interconnection further comprises
at least one continuous interconnect that extends diagonally through the encapsulation layer.

14. The apparatus of claim 11, wherein the means for gradient interconnection comprises a means for second gradient interconnection that includes:
a second encapsulation layer; and
at least one continuous second interconnect that extends vertically and horizontally through the second encapsulation layer.

15. The apparatus of claim 11, wherein the at least one continuous interconnect that extends vertically and horizontally through the encapsulation layer, includes a lead frame interconnect.

16. The apparatus of claim 11,
wherein the means for gradient interconnection is coupled to the first substrate through a first plurality of solder interconnects; and
wherein the means for gradient interconnection is coupled to the second substrate through a second plurality of solder interconnects.

17. The apparatus of claim 11, wherein the device includes a package on package (PoP).

18. The apparatus of claim 11,
wherein the first substrate has a first width, and
wherein the second substrate has a second width that is equal or less than the first width.

19. The apparatus of claim 11,
wherein the first substrate has a first width, and
wherein the second substrate has a second width that is greater than the first width.

20. The apparatus of claim 11, wherein the apparatus is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

21. A device comprising:
a first package comprising:
a first substrate;
a first gradient interconnect structure coupled to the first substrate, wherein the first gradient interconnect structure is coupled to the first substrate through a first plurality of solder interconnects; and
a first integrated device coupled to the first substrate; and
a second package coupled to the first package, the second package comprising:
a second substrate, wherein the second substrate is coupled to the first gradient interconnect structure through a second plurality of solder interconnects; and
a second integrated device coupled to the second substrate.

22. The device of claim 21, wherein the first gradient interconnect structure is located between the first substrate and the second substrate.

23. The device of claim 21, wherein the first gradient interconnect structure comprises:
a first encapsulation layer; and
at least one continuous first interconnect that extends diagonally through the first encapsulation layer.

24. The device of claim 23, further comprising a second gradient interconnect structure coupled to the first substrate, wherein the second gradient interconnect structure comprises:
a second encapsulation layer; and
at least one continuous second interconnect that extends vertically and horizontally through the second encapsulation layer.

25. The device of claim 21, wherein the first gradient interconnect structure comprises:
an encapsulation layer; and
at least one continuous interconnect that extends vertically and horizontally through the encapsulation layer, wherein the at least one continuous interconnect includes a lead frame interconnect.

* * * * *